United States Patent [19]

Sokolov et al.

[11] Patent Number: 4,675,911
[45] Date of Patent: Jun. 23, 1987

[54] MONOLITHIC MICROWAVE INTEGRATED CIRCUIT BROADBAND MIXER

[75] Inventors: Vladimir Sokolov, Shakopee, Minn.; James B. Beyer, Madison, Wis.

[73] Assignee: Honeywell Inc., Minneapolis, Minn.

[21] Appl. No.: 865,330

[22] Filed: May 21, 1986

Related U.S. Application Data

[63] Continuation-in-part of Ser. No. 717,918, Mar. 29, 1985, abandoned.

[51] Int. Cl.⁴ .............................................. H04B 1/28
[52] U.S. Cl. ...................................... 455/325; 455/332; 455/333; 332/43 B; 330/54
[58] Field of Search ............... 455/332, 333, 325, 326; 332/43 B; 330/54, 55

[56] References Cited

U.S. PATENT DOCUMENTS

| | | | |
|---|---|---|---|
| 2,957,143 | 10/1960 | Enloe | 330/54 |
| 4,317,230 | 2/1982 | Boubouliex | 455/333 |
| 4,369,522 | 1/1983 | Cerny, Jr. et al. | 455/333 |
| 4,413,239 | 11/1983 | Romeo et al. | 455/333 |
| 4,423,386 | 12/1983 | Gerard | 330/54 |
| 4,486,719 | 12/1984 | Ayasli | 330/54 |
| 4,540,954 | 9/1985 | Apel | 330/54 |
| 4,595,881 | 6/1986 | Kennan | 330/54 |

OTHER PUBLICATIONS

Wayne Kennan et al, "A Miniature 2–18 GHz Monolithic GaAs Distributed Amplifier", pp. 41–44, 1984, IEEE.

R. B. Mouw et al, "Broadband Double Balanced Mixer/Modulators", Mar. 1969, Microwave Journal, Part I, 4 pages.

R. B. Mouw et al, "Broadband Double Balanced Mixer/Modulators", Microwave Journal, 6 pages, Part II.

Primary Examiner—Jin F. Ng
Assistant Examiner—Elissa Seidenglanz
Attorney, Agent, or Firm—O. R. Dahle

[57] ABSTRACT

A monolithic microwave integrated circuit broadband mixer in which the distributed amplifier concept is used to develop a broadband mixer circuit.

8 Claims, 11 Drawing Figures

MONOLITHIC MICROWAVE INTEGRATED CIRCUIT BROADBAND MIXER

This application is a continuation-in-part of application Ser. No. 717,918 filed Mar. 29, 1985 now abandoned.

BACKGROUND AND SUMMARY OF THE INVENTION

The invention is directed to the art of high frequency (>1 GHz) multi-octave distributed amplifier driver and combiner circuitry with gain, to accomplish wideband frequency mixing. High frequency wide bandwidth monolithic distributed circuits have been known in the art for applications mainly as broadband microwave amplifiers. The present application, however, integrates the monolithic distributed amplifier into a broadband mixer circuit. The circuitry is compatible with GaAs monolithic integration and applicable to microwave and mm-wave systems.

DESCRIPTION

Figure 1:
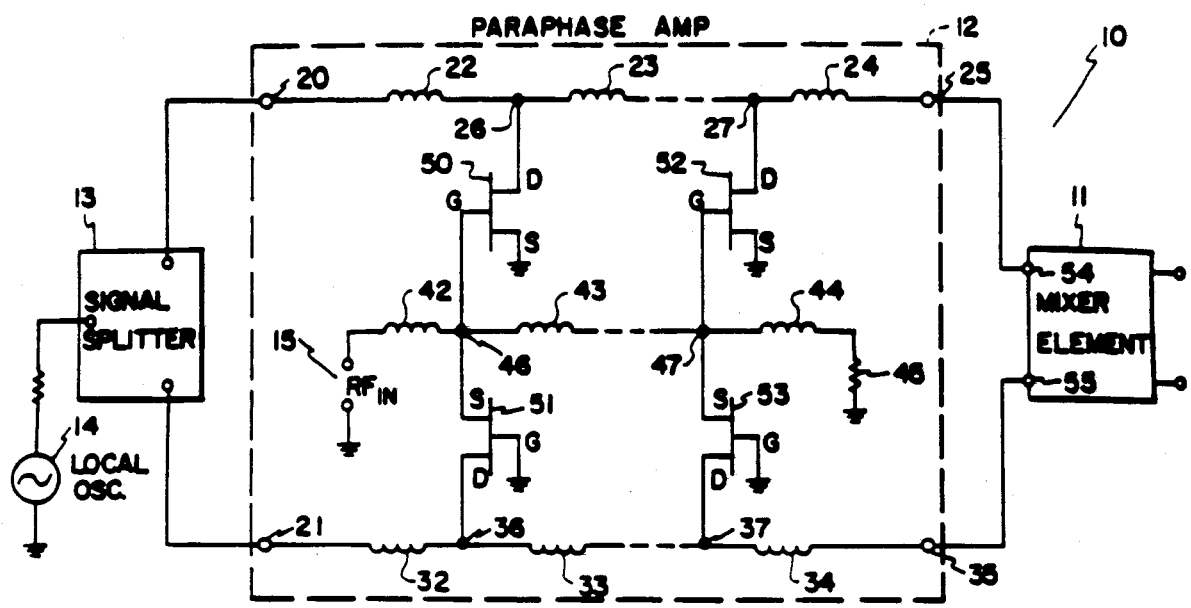
FIGS. 1, 1a and 1b are schematic diagrams of an embodiment of the monolithic broadband mixer according to the invention.
Figure 1B:
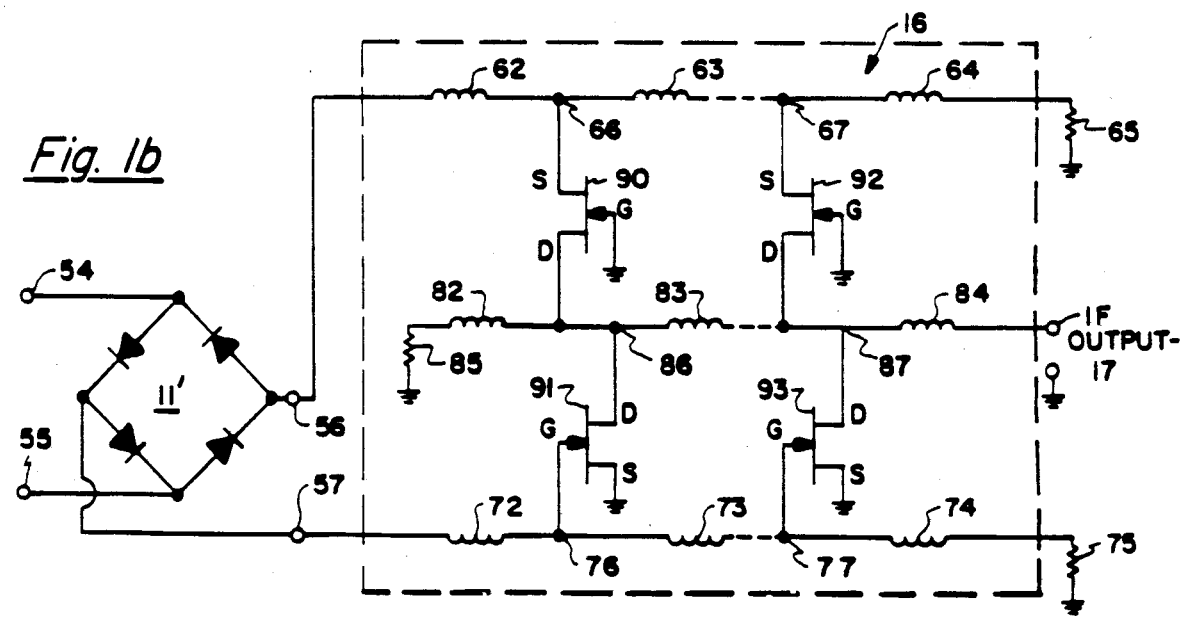
Figure 1A:
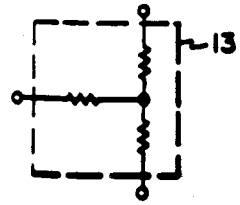

Referring now to the figures and initially to the arrangement of FIGS. 1, 1a and 1b there is disclosed a high frequency, (for example, 2-60 GHz) broadband mixer circuit 10 which has very generally a mixer element 11, a paraphase dual distributed amplifier 12, an input signal splitter 13, a local oscillator 14, an RF input port 15, a broadband distributed combiner 16 and an IF output port 17. The signal splitter 13 receives the signal from the local oscillator, splits the signal and delivers it in the same phase to input terminals 20 and 21 of the transmission line formed by the outboard series inductances and shunt capacitances of the broadband paraphase distributed amplifier 12. In a simple passive form the signal splitter may be a resistive network like that shown in FIG. 1a.

Dual distributed amplifier 12 is represented by the schematic as having two pairs of FETs but the number of cascaded pairs may vary as necessary. Input terminal 20 is shown connected through series inductive segments 22, 23 and 24 to amplifier output terminal 25. Similarly input terminal 21 is connected through series inductive segments 32, 33 and 34 to amplifier output terminal 35. RF input terminal 15 is connected through series inductive segments 42, 43 and 44 and a resistive element 45 to ground. Between segments 22 and 23 is a junction 26, and between segments 23 and 24 is a junction 27. Between segments 32 and 33 is a junction 36, and between segments 33 and 34 is a junction 37. Junctions 46 and 47 are similarly located intermediate the inductive elements 42, 43 and 44. A first FET 50 has its drain connected to junction 26, its source connected to ground, and its gate connected to junction 46. FET 50 is paired with FET 51 which has its source connected to junction 46, its drain to junction 36, and its gate connected to ground. Similarly, FET 52 has its drain connected to junction 27, its source to ground, and its gate to junction 47. It is paired with FET 53 which has its source connected to junction 47, its drain to junction 37, and its gate connected to ground. Thus the FETs 50 and 52, the inductive segments 22, 23 and 24, the common RF inductive segments 42, 43 and 44 and the associated capacitive effects shown in FIG. 2 comprise the first half of the dual distributed amplifier 12. The FETs 51 and 53, the inductive segments 32, 33 and 34, the common RF inductive segments 42, 43 and 44 and the associated capacitive effects comprise the second half of the dual distributed amplifier. The output terminals 25 and 35 of the dual distributed amplifier are connected to the input terminals 54 and 55 of mixer element 11.

The present mixer is conventional in the sense of converting RF energy at one frequency into energy at another frequency to make the signal processing easier. Mixers have been conventionally classified as single-ended, single-balanced, double-balanced, and double double-balanced to name several. An example of a double-balanced mixer shown in FIG. 1b is the ring modulator 11' which has output terminals 56 and 57. Terminals 56 and 57 are connected to the inputs of broadband distributed combiner 16. Terminal 56 is shown connected through series inductive segments 62, 63 and 64 and resistor 65 to ground. Terminal 57 is shown connected through series inductive segments 72, 73 and 74 and resistor 75 to ground. A common central leg terminating at IF output 17 can be traced from ground through resistor 85, and series inductive segments 82, 83 and 84. Between elements 62 and 63 is a junction 66; between elements 63 and 64 is a junction 67; between elements 72 and 73 is a junction 76; between elements 73 and 74 is a junction 77; between elements 82 and 83 is a junction 86 and between elements 83 and 84 is a junction 87. An FET 90 has its source connected to junction 66, its drain connected to junction 86 and its gate connected to ground. It is paired with FET 91 which has its drain connected to junction 86, its gate connected to junction 76, and its source connected to ground. Similarly FET 92 has its source connected to junction 67, its drain connected to junction 87 and its gate connected to ground. It is paired with FET 93 which has its drain connected to junction 87, its gate connected to junction 77 and its source connected to ground. Thus in this dual distributed combiner circuit the FETs 90 and 92, the inductive segments 62, 63 and 64, the common inductive segments 82, 83 and 84 and the associated distributed capacity including the FET capacity shown in FIG. 2, comprise the first half of the distributed combiner 16. The FETs 91 and 93, the inductive segments 72, 73 and 74, the common inductive segments 82, 83 and 84 and the associated distributed capacity comprise the second half of the dual distributed signal combiner.

Figure 2:
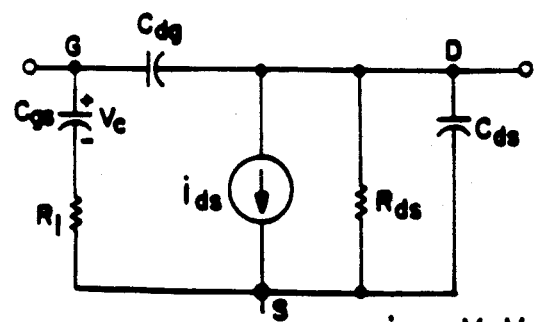
FIG. 2 shows a simplified equivalent circuit of a MESFET operating at GHz frequencies.

FIG. 2 shows a simplified equivalent circuit of the MESFETs operating at the high frequencies (>1 GHz) described herein. The capacitance gate-to-source, Cgs, forms a major part of the input transmission line capacitance, and the capacitance drain-to-source, Cds, forms a major part of the output transmission line capacitance.

Cdg is the drain to gate capacitance, $g_m$ is the transconductance, and $i_{dc}$ represents the voltage dependent current generator function of the FET.

Looking again at the dual distributed amplifier 12 of FIG. 1 it can be seen that the transistor pairs are cross bonded with each other which means the source electrode of each FET is connected to the gate of the other. In operation the same signal is fed to the drain of each of FETs 50 and 51 from the oscillator 14 while the RF signal causes opposite effects in the conductivity of FET 50 versus FET 51, for example. FET pair 52 and 53 is controlled in similar fashion. In the distributed combiner 16 of FIG. 1b, a similar circuit configuration exists and the opposite signals on input terminals 56 and 57 combine at the FET pairs to provide a single IF output at 17.

The mixer itself is the non-linear element shown in block diagram 11 in FIG. 1, and in a representative schematic form 11' in FIG. 1b. In the prior art conventional case this mixer element is driven by a passive transformer (balun) and the output at IF is likewise combined in a passive transformer. In this invention, however, the transformers are replaced by distributed amplifiers which provide conversion gain. The driver is a distributed paraphase amplifier which allows the RF signal to be applied to the mixer element in push-pull. The paraphase output transmission lines are driven by a local oscillator signal which provides a push-push drive to the mixer element.

Figure 3:
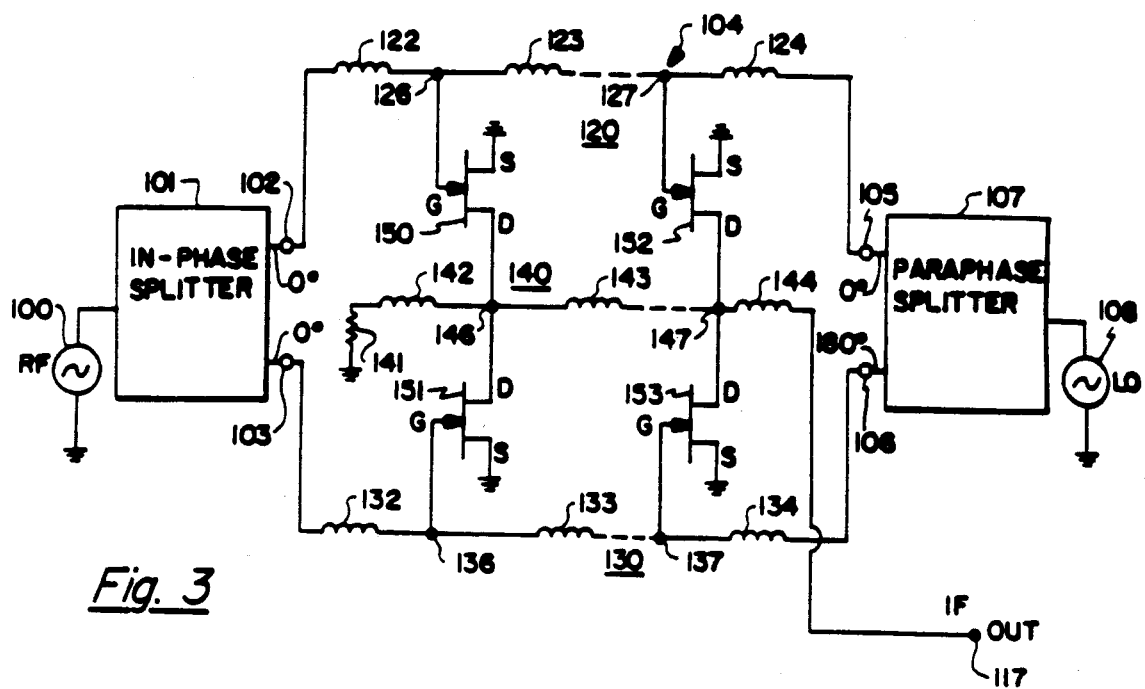
FIG. 3 is a schematic of another embodiment of a broadband monolithic balanced mixer using single gate FETs.
Figure 5:
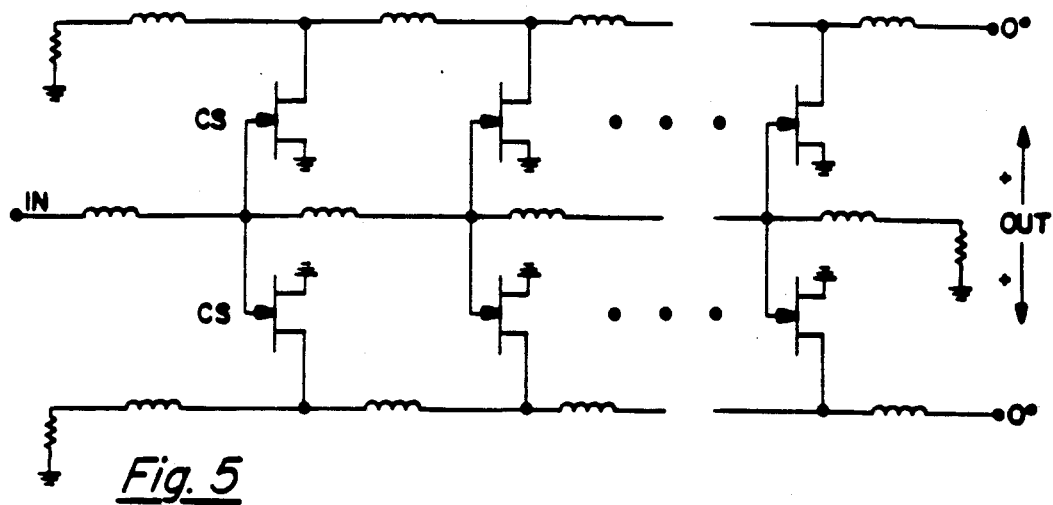
FIG. 5 is a schematic diagram of an in-phase active splitter in the form of a distributed amplifier.
Figure 6:
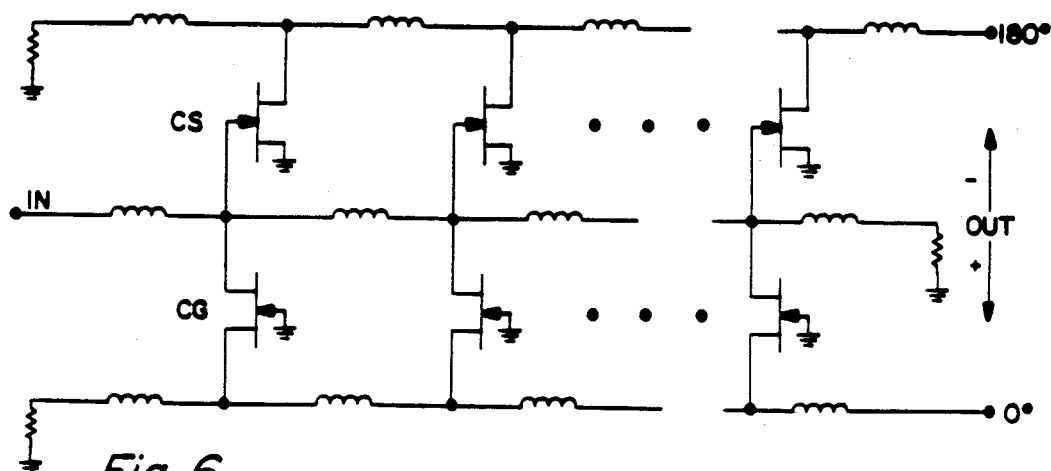
FIG. 6 is a schematic diagram of a paraphase active splitter in the form of a distributed amplifier.

Referring now to FIG. 3, there is disclosed another embodiment of the broadband monolithic dual distributed amplifier/mixer. In this figure the RF signal 100 is connected through an in-phase signal splitter 101 to RF input terminals 102 and 103 of the dual distributed amplifier/mixer generally shown at 104. In addition to the RF input terminals 102 and 103, the opposite ends of the transmission lines include input terminals 105 and 106 which are fed through a paraphase splitter 107 from a local oscillator 108. Both of the signal splitters can be active monolithic circuits using distributed circuit concepts as shown in FIGS. 5 and 6. A transmission line circuit 120 can be traced from terminal 102 through an inductive segment 122, a junction 126, an inductive segment 123, a junction 127, and an inductive segment 124 to the terminal 105. A similar circuit 130 can be traced from terminal 103 through an inductive segment 132, a junction 136, an inductive segment 133, a junction 137, and an inductive segment 134 to the terminal 106. A third common IF transmission line circuit 140 can be traced from ground through a resistive element 141, an inductive segment 142, a junction 146, an inductive segment 143, a junction 147, and an inductive segment 144 to IF output terminal 117. FETs 150, 151, 152 and 153 have grounded source electrodes. FET 150 has its gate connected to junction 126 and its drain connected to 146. The gate of FET 151 is connected to junction 136 and its drain to 146. The gate of FET 152 is connected to junction 127 and its drain to 147. The gate of FET 153 connects to 137 and the drain to 147.

Figure 3A:
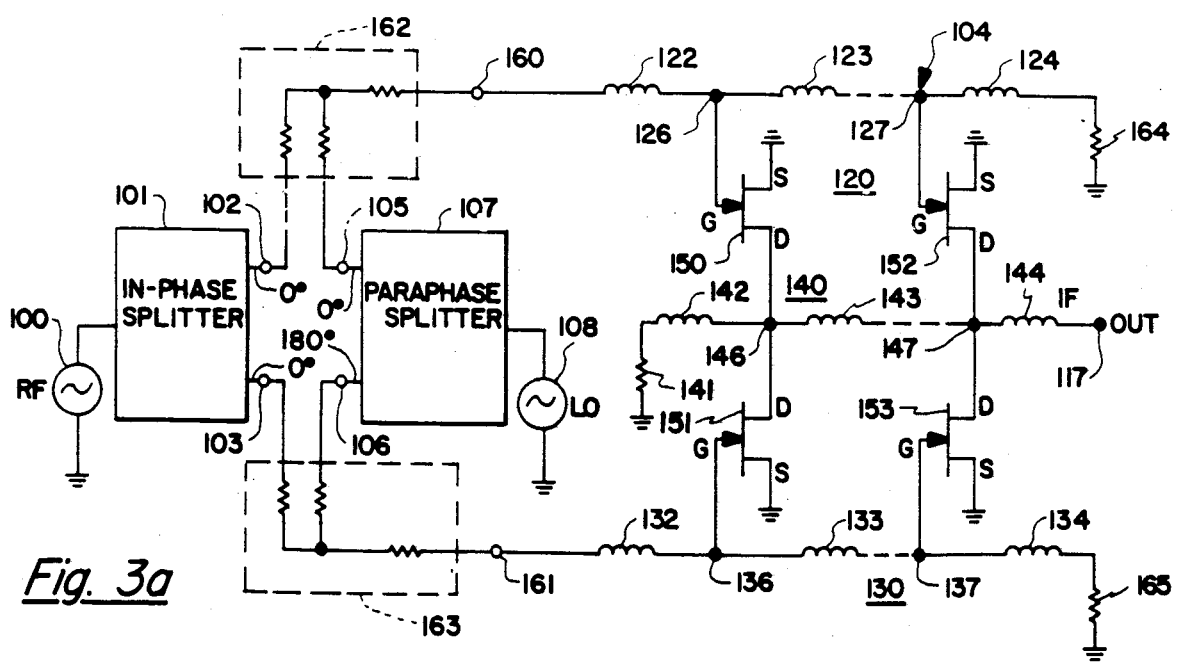
FIGS. 3a, 4a and 4b are modifications of FIGS. 3 and 4.

Thus the FETs 150 and 152, the inductive segments 122, 123 and 124, the inductive segments 142, 143 and 144 and the associated capacitive effects comprise the first half of the dual distributed amplifier/mixer. The FETs 151 and 153, the inductive segments 132, 133 and 134, the common inductive segments 142, 143 and 144 and the capacity effects comprise the second half of the dual distributed amplifier/mixer. The embodiment of this Figure also provides conversion gain. The configuration shown in FIG. 3 is limited to frequencies for which transmission lengths are short with respect to the wavelength. The modification shown in FIG. 3a overcomes this frequency limitation by changing the connection of the signals which were connected at terminals 105 and 106. In FIG. 3a the position of the local oscillator signal 108 with its paraphase splitter is moved so the signal can be introduced at terminals 160 and 161 together with the signal from the RF source 100. The signals at points 105 and 102 are fed to the terminal 160 via a resistive combiner 162. The signals at terminals 106 and 103 are fed to the terminal 161 via a resistive combiner 163. The transmission lines are now terminated by resistors 164 and 165.

Figure 4:
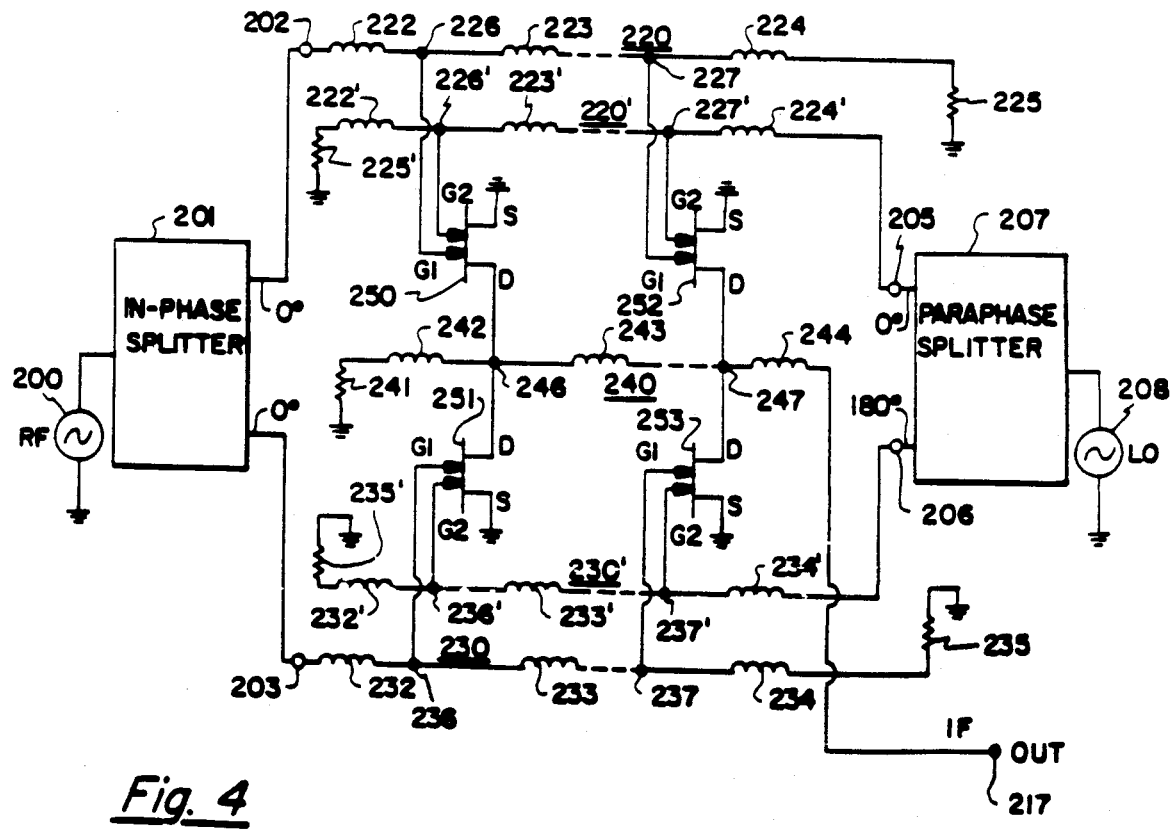
FIG. 4 is a modification of FIG. 3 using dual gate FETs.

A modification of the monolithic mixer of FIG. 3 is shown in FIG. 4 in which dual gate FETs 250, 251, 252 and 253 are used in place of the single gate FETs of FIG. 3. Separate transmission line portions 220 and 220', 230 and 230' are shown in FIG. 4 and will be explained, otherwise the circuit is similar to that explained in FIG. 3. A transmission line circuit 220 can be traced from in-phase splitter 201 through terminal 202, inductive segment 222, junction 226, inductive segment 223, junction 227, inductive segment 224 and resistor 225 to ground. A transmission line circuit 220' can be traced from paraphase splitter 207 through terminal 205, inductive segment 224', junction 227', inductive segment 223', junction 226', inductive segment 222' and resistor 225' to ground. Gate G1 and G2 of FET 250 are connected to junctions 226 and 226', respectively. Gate G1 and G2 of FET 252 are connected to junctions 227 and 227', respectively.

A transmission line circuit 230 can be traced from splitter 201 through terminal 203, inductive segment 232, junction 236, inductive segment 233, junction 237, inductive segment 234 and resistor 235 to ground. A transmission line circuit 230' can be traced from paraphase splitter 207 through terminal 206, inductive segment 234', junction 237', inductive segment 233', junction 236', inductive segment 232' and resistor 235' to ground. Gates G1 and G2 of FET 251 are connected to junctions 236 and 236' respectively. Gates G1 and G2 of FET 253 are connected to junctions 237 and 237' respectively. IF output transmission line circuit 240 can be traced from ground through resistor 241, an inductive segment 242, a junction 246, an inductive segment 243, a junction 247, and an inductive segment 244 to IF output terminal 217. FETs 250 and 251 each has its drain connected to junction 246 and FETs 252 and 253 each has its drain connected to junction 247. The source electrodes of each of the four FETs is grounded.

Figure 4A:
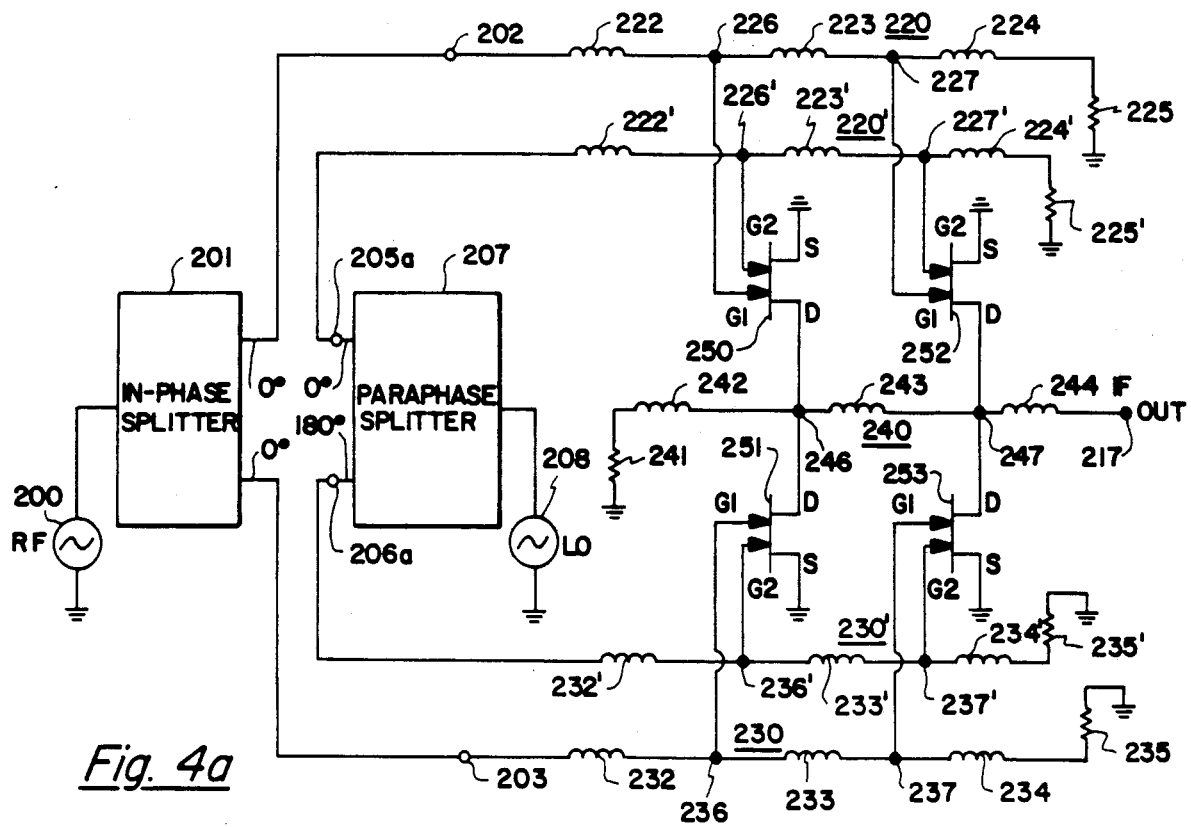

A modification of FIG. 4 is shown at FIG. 4a and is preferred over FIG. 4 in that it can operate at higher frequencies than that of FIG. 4. In FIG. 4a the frequency response is improved by changing the position of the connection of the local oscillator 208 signal to the lines 220' and 230' at terminals 205a and 206a. In FIG. 4a a transmission line circuit 220' can be traced from paraphase splitter 207 through terminal 205a, inductive segment 222', junction 226, inductive segment 223', junction 227, inductive segment 224' and resistor 225' to ground. A transmission line circuit 230' can be traced from paraphase splitter 207 through terminal 206a, inductive segment 232', junction 236', inductive segment 233', junction 237', inductive segment 234' and resistor 235' to ground. The other transmission lines remain as explained earlier in FIG. 4.

Figure 4B:
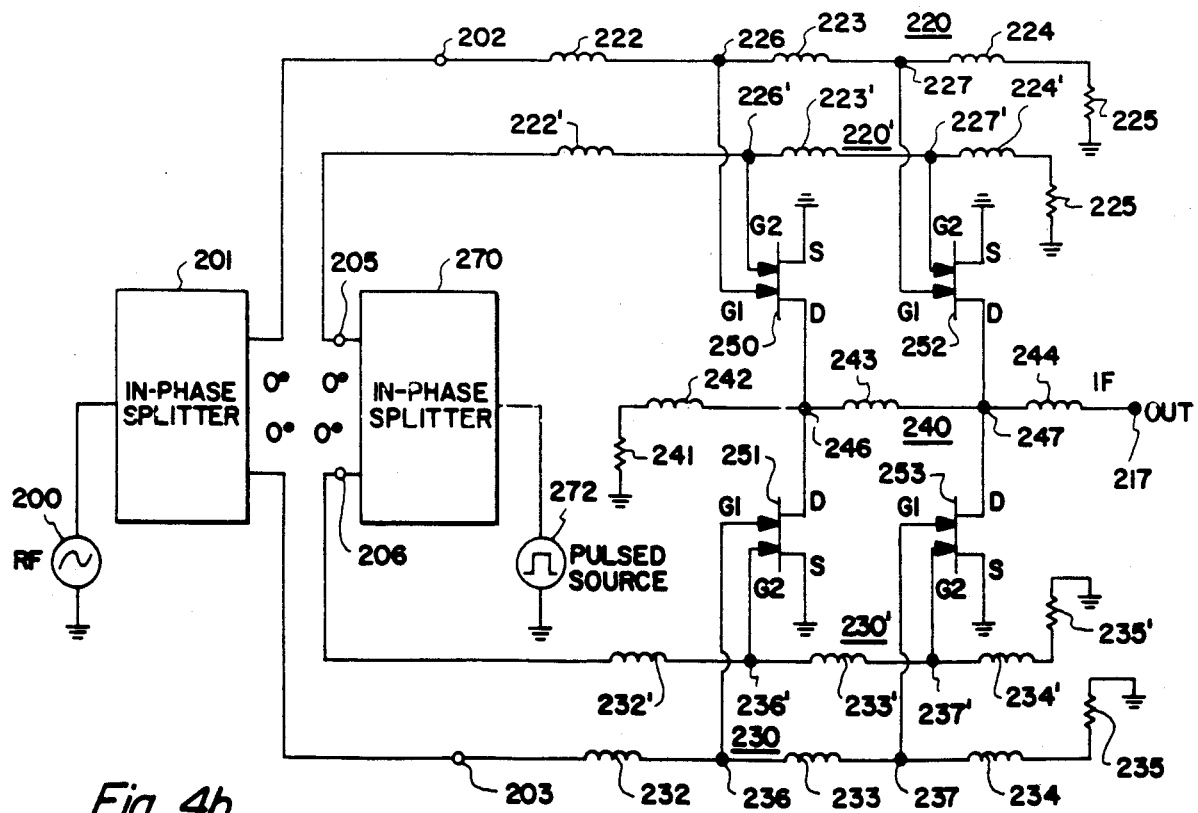

If the paraphase splitter 207 of FIG. 4a is replaced by an in-phase splitter 270 as shown in FIG. 4b and the local oscillator 208 is replaced by a pulse source 272 with pulse lengths short with respect to the RF period of source 200, then the mixer becomes a sampling mixer with gain. Each transistor samples the RF signal at the same phase point and the sampled currents combine constructively in the drain transmission line yielding the sampled voltage across the IF out point 217.

The upper and lower transistor chains of FIGS. 4, 4a and 4b operate independently so that only the upper or lower half need be utilized in which case the gain would be lowered by 3 db over that of the circuit shown.

The embodiments described in FIGS. 3 and 4 show a broadband mixer circuit with conversion gain which utilizes either single gate FETs 150, 151, 152 and 153 in FIG. 3 or dual gate FETs 250, 251, 252 and 253 in FIG. 4 for the mixing elements. The active splitters as well as the FETs used for mixing are realized as distributed amplifiers shown in FIGS. 5 and 6. The paraphase splitter and the in-phase splitter provides, respectively, push-pull and push-push signals of the RF signal and the local oscillator signal to drive the mixer FETs. The entire circuit is compatible for monolithic integration.

Referring again to the embodiment of FIGS. 1 and 1b, it will be appreciated that the mixer 11, 11', which is there shown in a ring modulator form, may also be an active distributed mixer.

The embodiments of the invention in which an exclusive property or right is claimed are defined as follows:

1. A broadband distributed amplifier/mixer for frequency mixing in the gigahertz range comprising:
    artificial transmission line means including first and second artificial transmission line means, each having serially connected inductive segments;
    first input terminals connected to said transmission line means and adapted to be connected to an RF source;
    second input terminals connected to said transmission line means and adapted to be connected to a local oscillator source;
    a plurality of FETs in said distributed amplifier/mixer, including a first plurality of FETs each having an electrode connected along said first transmission line means, and including
    a second plurality of FETs each having an electrode connected along said second transmission line means; and,
    IF (intermediate frequency) artificial transmission line means having serially connected inductive segments, said IF transmission line means being connected to an output electrode of at least some of said FETs.

2. A broadband IC distributed amplifier/mixer circuit comprising:
    a pair of transmission line means;
    an output transmission line;
    a first plurality of FETs each having an electrode connected along a first one of said pair of transmission line means and also each having another electrode connected to said output transmission line;
    a second plurality of FETs each having an electrode connected along a second one of said pair of transmission line means and also each having another electrode connected to said output transmission line;
    said first and second plurality of FETs making up a dual distributed amplifier/mixer circuit; and,
    first input means adapted to be connected to a first signal and second input means adapted to be connected to a second signal, said first input means and said second input means both being connected to said dual circuit and applying said first signal and said second signal respectively to said dual circuit to be amplified and mixed, said first signal being applied in push-pull to said dual circuit and said second signal being applied in-phase to said circuit for frequency mixing.

3. A dual distributed amplifier/mixer comprising:
    a dual distributed amplifier/mixer having first and second sections, the first section comprising first artificial transmission line means having a plurality of distributed inductive segments therealong, said first transmission line means having RF input terminals and local oscillator input terminals connected therewith,
    a first plurality of FETs in said first section each having input circuits connected along said first transmission line means between said segments,
    the second section comprising second artificial transmission line means having a plurality of inductive segments distributed therealong, said second transmission line means having RF input terminals and local oscillator input terminals associated therewith,
    a second plurality of FETs in said second section each having input circuits connected along said second transmission line means between said segments,
    said dual distributed amplifier/mixer also having a common IF output artificial transmission line having a plurality of inductive segments distributed therealong, said first and second sections having output connections to said IF output transmission line.

4. The distributed amplifier/mixer circuit according to claim 3 in which said RF and LO input terminals are adapted to be connected to RF and LO signals respectively, one of said RF and LO signals being applied in push-pull to said dual circuit and the other of said RF and LO signals being applied in-phase to said circuit for frequency mixing.

5. The distributed amplifier/mixer circuit according to claim 3 in which said first plurality of FETs has the gate electrodes connected along the first of said transmission line means and the drain electrodes connected to said IF transmission line, and said second plurality of FETs has the gate electrodes connected along the second of said transmission line means and the drain electrodes connected to said IF transmission line.

6. The distributed amplifier/mixer circuit according to claim 3 in which said plurality of FETs are single gate FETs.

7. The distributed amplifier/mixer circuit according to claim 3 in which said pluralities of FETs are dual gate FETs, and in which said first and second artificial transmission line means each has one distributed circuit connected to the RF input terminals and another distributed circuit connected to the local oscillator input terminals, said one distributed circuit being connected to a first gate of said dual gate FETs and said another distributed circuit being connected to a second gate of said dual gate FETs.

8. A monolithic broadband IC distributed amplifier/mixer circuit comprising:
    a pair of artificial transmission line means;

an IF output artificial transmission line;
a first plurality of FETs each having a gate electrode connected along a first of said transmission line means and also having a drain electrode connected to said IF output transmission line;
a second plurality of FETs each having a gate electrode connected along a second of said transmission line means and also having a drain electrode connected to said IF output transmission line;
said first and second plurality of FETs making up a dual distributed amplifier/mixer circuit; and,
first input means adapted to be connected to a RF signal and second input means adapted to be connected to a local oscillator signal, said first input means and said second input means both being connected to said dual circuit and applying said RF signal and said local oscillator signal respectively to said dual circuit to be amplified and mixed, one of said RF and local oscillator signals being applied in push-pull to said dual circuit and the other of said RF and local oscillator signals being applied in-phase to said circuit for frequency mixing.

* * * * *